(12) United States Patent
Ohtsu

(10) Patent No.: US 10,091,879 B2
(45) Date of Patent: Oct. 2, 2018

(54) CONDUCTOR CONNECTING STRUCTURE AND MOUNTING BOARD

(71) Applicant: FUJI XEROX CO., LTD., Tokyo (JP)

(72) Inventor: Shigemi Ohtsu, Kanagawa (JP)

(73) Assignee: FUJI XEROX CO., LTD., Minato-ku, Tokyo (JP)

( * ) Notice: Subject to any disclaimer, the term of this patent is extended or adjusted under 35 U.S.C. 154(b) by 0 days.

(21) Appl. No.: 15/207,721

(22) Filed: Jul. 12, 2016

(65) Prior Publication Data

US 2017/0064829 A1 Mar. 2, 2017

(30) Foreign Application Priority Data

Aug. 31, 2015 (JP) ................................. 2015-171443

(51) Int. Cl.
*H05K 1/00* (2006.01)
*H05K 1/14* (2006.01)
(Continued)

(52) U.S. Cl.
CPC ............... *H05K 1/144* (2013.01); *H01R 4/04* (2013.01); *H01R 12/62* (2013.01); *H05K 1/0298* (2013.01);
(Continued)

(58) Field of Classification Search
CPC ............. H01L 21/4867; H01L 23/3114; H01L 23/5389; H01L 24/81; H01L 24/82; H01L 24/97; H01L 2224/18; H01L 2224/97; H01L 2224/16237; H01L 2224/76155; H01L 2224/81801; H01L 2224/82039;
(Continued)

(56) References Cited

U.S. PATENT DOCUMENTS

2002/0012096 A1* 1/2002 Uchiyama ........... G02F 1/13452
349/187
2002/0024348 A1* 2/2002 Jones ................. G01R 1/06744
324/756.05
(Continued)

FOREIGN PATENT DOCUMENTS

JP 2002-315095 A 10/2002
JP 2007-250662 A 9/2007
(Continued)

*Primary Examiner* — Timothy Thompson
*Assistant Examiner* — Guillermo Egoavil
(74) *Attorney, Agent, or Firm* — Sughrue Mion, PLLC

(57) ABSTRACT

A conductor connecting structure includes a mounting board, a target board, and an anisotropic conductive material. The mounting board includes a base material including a first surface, a second surface, and an end surface. The mounting board also includes a first conductor layer and a second conductor layer. The target board includes a mounting surface and a third conductor layer formed on the mounting surface. The anisotropic conductive material includes a polymeric material and electrically conductive particles dispersed in the polymeric material. The electrically conductive particles, when heated, aggregate to connect an end portion of the first or second conductor layer to the third conductor layer. One of the end portions not subjected to connection established with the anisotropic conductive material is separated further from the end surface of the base material than another end portion which is connected to the third conductor layer.

11 Claims, 5 Drawing Sheets

(51) Int. Cl.
*H05K 1/09* (2006.01)
*H05K 1/02* (2006.01)
*H05K 1/11* (2006.01)
*H01R 4/04* (2006.01)
*H01R 12/62* (2011.01)

(52) U.S. Cl.
CPC .............. *H05K 1/092* (2013.01); *H05K 1/117* (2013.01); *H05K 1/118* (2013.01); *H05K 2201/041* (2013.01); *H05K 2201/05* (2013.01)

(58) Field of Classification Search
CPC ....... H01L 2224/82102; H01L 2924/14; H01L 2924/181; H01L 2924/0103; H01L 2924/0105; H01L 2924/01005; H01L 2924/01006; H01L 2924/01013; H01L 2924/01015; H01L 2924/01027; H01L 2924/01029; H01L 2924/01033; H01L 2924/01047; H01L 2924/01075; H01L 2924/09701; H01L 2924/01079; H01L 2924/01082; H01L 2924/12042; H01L 2924/12044; H01L 2924/15787; H01L 2924/19041; H01R 4/04; H01R 4/028; H01R 12/52; H01R 12/62; H05K 1/18; H05K 1/092; H05K 1/117; H05K 1/118; H05K 1/144; H05K 1/147; H05K 1/181; H05K 1/0213; H05K 1/0298; H05K 3/32; H05K 3/323; H05K 3/341; H05K 3/363; H05K 3/368; H05K 2201/05; H05K 2201/041; H05K 2201/0129; H05K 2201/0215; H05K 2203/048; H05K 2203/1189; H05K 2203/1469
USPC ................. 257/E21.509, E23.178; 361/749; 438/106, 612
See application file for complete search history.

(56) References Cited

U.S. PATENT DOCUMENTS

| | | | |
|---|---|---|---|
| 2005/0070046 A1* | 3/2005 | Saito | H01L 21/4867 438/106 |
| 2007/0218781 A1 | 9/2007 | Yokai et al. | |
| 2007/0246247 A1* | 10/2007 | Ooyabu | G11B 5/486 174/255 |
| 2013/0213691 A1* | 8/2013 | Park | H01B 3/082 174/126.4 |
| 2016/0262258 A1* | 9/2016 | Tanabe | H05K 1/0213 |
| 2017/0064828 A1* | 3/2017 | Ohtsu | H05K 1/144 |

FOREIGN PATENT DOCUMENTS

| | | |
|---|---|---|
| JP | 2011-146664 A | 7/2011 |
| JP | 2014-56816 A | 3/2014 |
| JP | 2014-96362 A | 5/2014 |

* cited by examiner

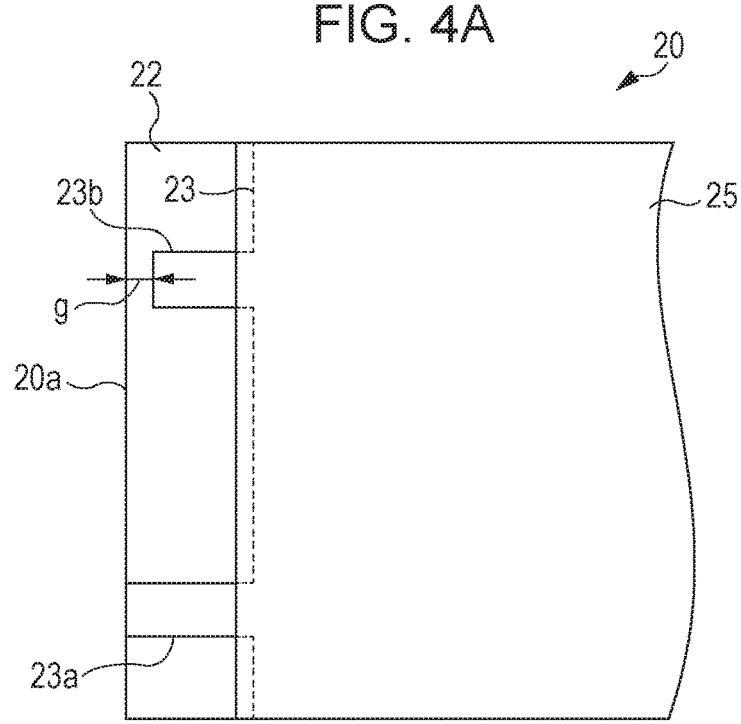
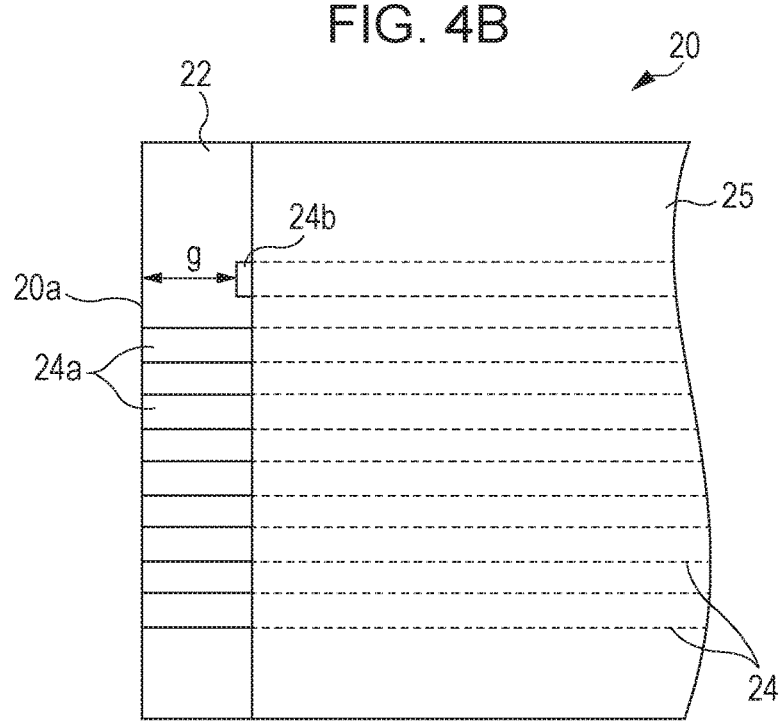

US 10,091,879 B2

CONDUCTOR CONNECTING STRUCTURE AND MOUNTING BOARD

CROSS-REFERENCE TO RELATED APPLICATIONS

This application is based on and claims priority under 35 USC 119 from Japanese Patent Application No. 2015-171443 filed Aug. 31, 2015.

BACKGROUND

Technical Field

The present invention relates to a conductor connecting structure and a mounting board.

SUMMARY

According to an aspect of the present invention, a conductor connecting structure includes a mounting board, a target board, and an anisotropic conductive material. The mounting board includes a base material that is formed of an insulating material and that includes a first surface, a second surface, and an end surface. The mounting board also includes a first conductor layer that is formed on the first surface and that has an end portion and a second conductor layer that is formed on the second surface and that has an end portion. The target board includes a mounting surface on which the mounting board is mounted and a third conductor layer formed on the mounting surface. The anisotropic conductive material includes a polymeric material and electrically conductive particles that are dispersed in the polymeric material. When the electrically conductive particles are heated, the electrically conductive particles aggregate so as to connect the end portion of the first conductor layer or the end portion of the second conductor layer and the third conductor layer to each other. In the mounting board, one end portion not subjected to connection established with the anisotropic conductive material out of the end portion of the first conductor layer and the end portion of the second conductor layer is separated further from the end surface of the base material than another end portion connected to the third conductor layer out of the end portion of the first conductor layer and the end portion of the second conductor layer.

BRIEF DESCRIPTION OF THE DRAWINGS

Exemplary embodiment of the present invention will be described in detail based on the following figures, wherein:

FIGS. 4A and 4B are the appearance of a double-sided flexible printed circuit (FPC), and out of FIGS. 4A and 4B, FIG. 4A is a plan view of the appearance of the FPC and FIG. 4B is a rear view of the appearance of the FPC.

DETAILED DESCRIPTION

Figure 1:
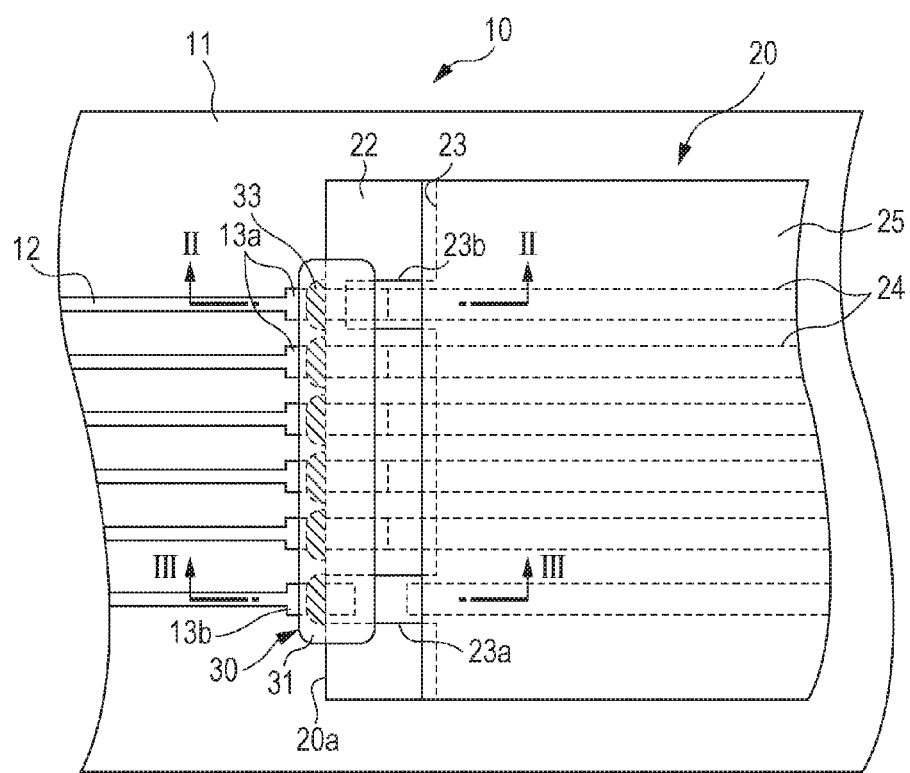
FIG. 1 is a plan view of part of a conductor connecting structure according to an exemplary embodiment of the present invention.

An exemplary embodiment of the present invention will be described below with reference to the drawings. In the drawings, elements having the same or similar functions are denoted by the same reference numerals, thereby redundant description thereof is omitted. In order to clearly illustrate the feature of the exemplary embodiment, sizes may be excessively enlarged or reduced and shapes may be emphasized in the drawings. Thus, elements are not necessarily drawn to scale and the shapes of the elements in the drawings are not necessarily the same as those of actual elements.

Figure 2A:
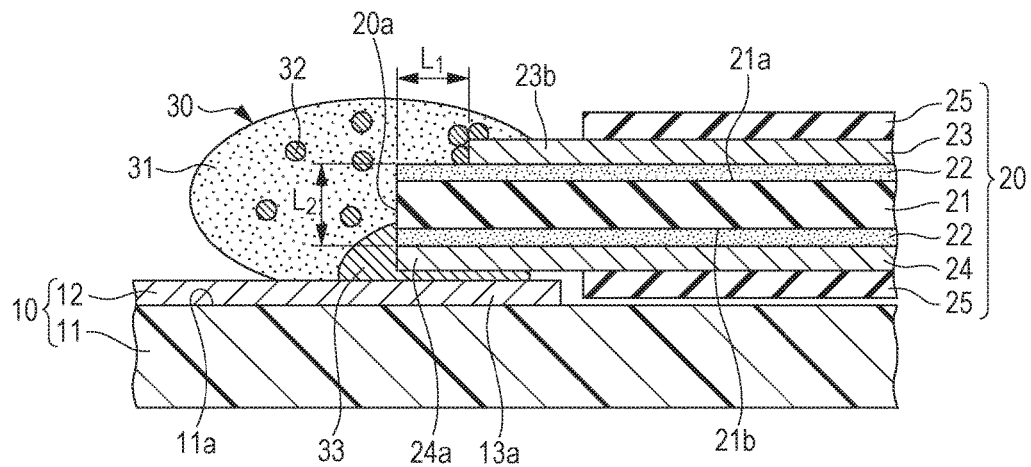
FIG. 2A is a sectional view of a state of a structure of FIG. 1 after heating taken along line II-II of FIG. 1.
Figure 2B:
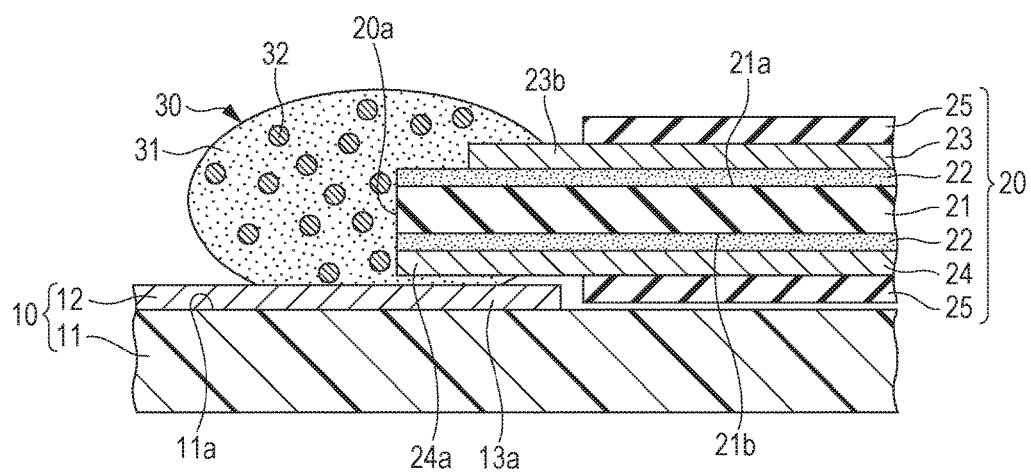
FIG. 2B is a sectional view of a state of the structure of FIG. 1 before heating taken along line II-II of FIG. 1.
Figure 3A:
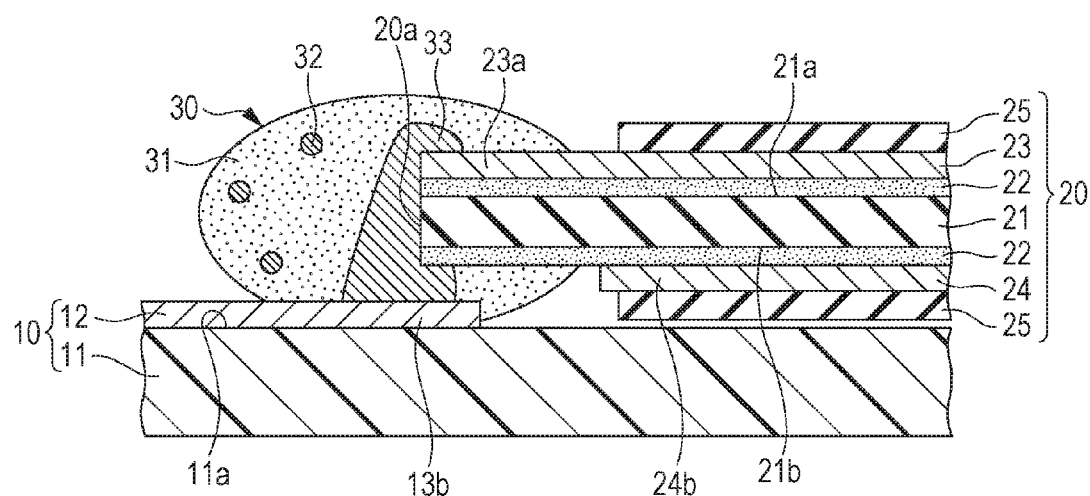
FIG. 3A is a sectional view of the state of the structure of FIG. 1 after heating taken along line III-III of FIG. 1.
Figure 3B:
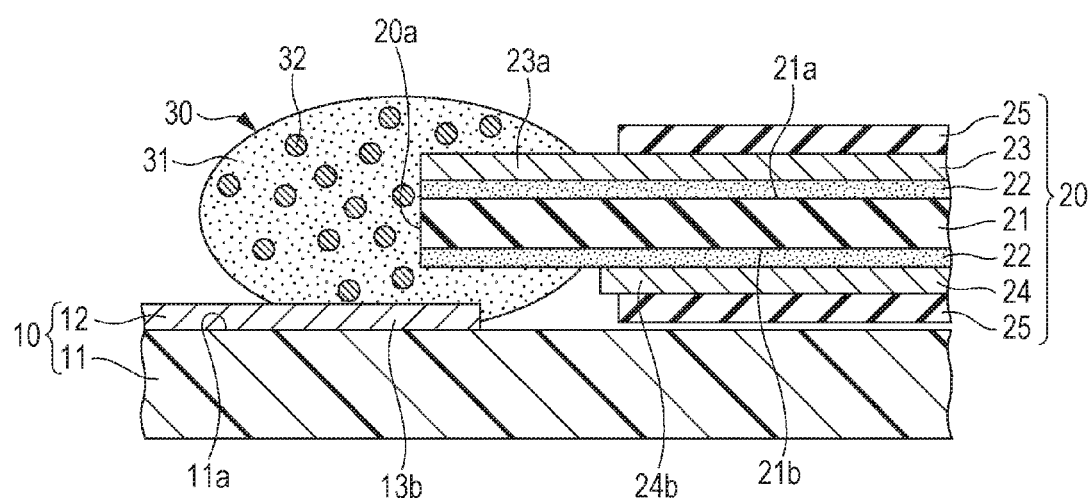
FIG. 3B is a sectional view of the state of the structure of FIG. 1 before heating taken along line III-III of FIG. 1.

FIG. 1 is a plan view of part of a conductor connecting structure according to the exemplary embodiment of the present invention. FIG. 2A is a sectional view of a state of a structure of FIG. 1 after heating taken along line II-II of FIG. 1, and FIG. 2B is a sectional view of a state of the structure of FIG. 1 before heating taken along line II-II of FIG. 1. FIG. 3A is a sectional view of the state of the structure of FIG. 1 after heating taken along line III-III of FIG. 1, and FIG. 3B is a sectional view of the state of the structure of FIG. 1 before heating taken along line III-III of FIG. 1. FIGS. 4A and 4B are the appearance of a double-sided flexible printed circuit (FPC), and out of FIGS. 4A and 4B, FIG. 4A is a plan view of the appearance of the FPC and FIG. 4B is a rear view of the appearance of the FPC.

The conductor connecting structure according to the present exemplary embodiment includes, as illustrated in FIG. 1, a printed wiring board (PWB) 10, a double-sided FPC 20 mounted on the PWB 10, and anisotropic conductive paste 30 with which a conductor layer of the PWB 10 and conductor layers of the double-sided FPC 20 are solder connected to one another only by heating. The conductor layer of the PWB 10 and the conductor layers of the double-sided FPC 20 will be described later. Hear, the PWB 10 is an example of a target board, the double-sided FPC 20 is an example of a mounting board, and the anisotropic conductive paste 30 is an example of an anisotropic conductive material.

The Structure of the PWB

As illustrated in FIGS. 2A to 3B, the PWB 10 is a rigid board that includes a base material 11 formed of an insulating material such as glass epoxy resin and plural wiring traces 12 formed on a surface 11a of the base material 11 on which the double-sided FPC 20 is mounted. Here, the wiring traces 12 are examples of a third conductor layer. An FPC may be used instead of the PWB 10.

The wiring traces 12 have pads 13a and 13b formed at its end portions for electrical connection to the double-sided FPC 20. Out of the plural pads 13a and 13b, the pad 13b which is at the lower end in FIG. 1 is shorter than the other pads 13a. Here, the pads 13a are examples of an end portion of the third conductor layer connected to a second conductor layer. The pad 13b is an example of an end portion of the third conductor layer not connected to the second conductor layer.

The Structure of the Double-Sided FPC

As illustrated in FIGS. 2A to 3B, the double-sided FPC 20 includes a base material 21, a ground layer 23, plural signal lines 24, and protective layers 25. The base material 21 has a first surface 21a and a second surface 21b and is formed of an insulating material such as polyimide. The ground layer 23 is formed on the first surface 21a side of the base material 21 with one of adhesion layers 22 interposed therebetween. The plural signal lines 24 are formed on the second surface 21b side of the base material 21 with another of the adhesion layers 22 interposed therebetween. The protective layers 25 protect the ground layer 23 and the plural signal lines 24. Here, the ground layer 23 is an example of a first conductor layer, and the signal lines 24 are an example of the second conductor layer.

The thickness of the base material 21 is preferably 50 µm or less or 30 µm or less so as to ensure flexibility and control the distance between conductors for reliably obtaining the flexibility and selectively allowing solder growth portions 33 to be formed. The control of the distance between conductors will be described later.

Referring to FIGS. 1 and 4A, the ground layer 23 is formed of, for example, a metal foil such as a copper foil and has two end portions, that is, an end portion 23a and an end portion 23b. The end portion 23a extends to an end surface 20a of the double-sided FPC 20 without a gap provided therebetween. Regarding the end portion 23b, a gap g (for example, 0.1 mm or more) is provided between the end portion 23b and the end surface 20a of the double-sided FPC 20. Here, the end portion 23a is an example of an end portion of the first conductor layer connected to the third conductor layer. The end portion 23b is an example of an end portion of the first conductor layer not connected to the third conductor layer.

The plural signal lines 24 are formed of a metal foil such as a copper foil. Referring to FIGS. 1 and 4B, regarding an end portion 24b of one of the signal lines 24 out of the plural signal lines 24, which is at the lower end in FIG. 1 and at the upper end in FIG. 4B, a gap g (for example, 0.1 mm or more) is provided between the end portion 24b and the end surface 20a of the double-sided FPC 20. End portions 24a of the other signal lines 24 extend to the end surface 20a of the double-sided FPC 20 without gaps provided therebetween. The widths of the signal lines 24 are preferably from 50 to 150 µm. The end portions 24a of the signal lines 24 are examples of an end portion of the second conductor layer connected to the third conductor layer. The end portion 24b of the one of the signal lines 24 is an example of an end portion of the second conductor layer not connected to the third conductor layer.

Furthermore, the double-sided FPC 20 has no through hole through which the ground layer 23 and the signal lines 24 are connected to one another. High-speed signals of, for example, 100 MHz to 10 GHz are transmitted through the signal lines 24. The protective layers 25 may be formed of, for example, an insulating film such as a polyimide film.

The double-sided FPC 20 is fabricated, for example, as follows. That is, a flexible copper clad lamination (FCCL) board that includes Cu foils bonded to both sides thereof is prepared. Patterning is performed on the Cu foil on one of the sides of the FCCL board by photolithography so as to form a circuit that includes the plural signal lines 24, and a region of the end portion 24b of the signal line 24 which is intended not to be solder connected is etched so as to provide the gap g between the end portion 24b and the end surface 20a. Next, patterning is performed on the Cu foil on the opposite side of the FCCL board by photolithography so as to form the ground layer 23, and a region in the end portion 23b which is intended not to be solder connected is etched so as to provide the gap g between the end portion 23b and the end surface 20a. At last, polyimide films which are thermocompression bonding films and to serve as the protective layers 25 are bonded. Thus, the double-sided FPC 20 is obtained.

A Configuration of the Anisotropic Conductive Paste

The anisotropic conductive paste 30 includes a polymeric material 31 and low-temperature solder particles (simply referred to as "solder particles" hereafter) 32 dispersed in the polymeric material 31. The melting point of the solder particles 32 is, for example, 185° C. or less. When the anisotropic conductive paste 30 is heated, the solder particles 32 dispersed in the polymeric material 31 move and grow (or also referred to as "aggregate"). When there is a conductor near the solder particles 32, the solder growth portions 33 are formed on the conductor. However, when the solder particles 32 are separated from the conductor by a certain distance or more, the solder particles do not grow on the conductor. Thus, it is possible to selectively form the solder growth portions 33 by controlling the distance between the conductors. Here, the solder particles 32 are an example of electrically conductive particles.

That is, when the anisotropic conductive paste 30 is used, in the case where the distances between the end portions of the third conductor layer of the PWB 10 and the end portions of the first conductor layer or the second conductor layer of the double-sided FPC 20 are a first value (for example, 80 µm or 50 µm) or less, solder connection is able to be established through the growth of the solder particles 32 and the formation of the solder growth portions 33, and in the case where the distances between the end portions of the third conductor layer and the end portions of the first conductor layer or the second conductor layer are a second value (for example, 100 µm or 120 µm) or more, the solder particles 32 are not able to grow, and accordingly, the end portions of the third conductor layer and the end portions of the first conductor layer or the second conductor layer are insulated from one another.

Specifically, as illustrated in FIGS. 2A to 3B, the anisotropic conductive paste 30 electrically connects the pads 13a of the wiring traces (third conductor layer) 12 on the PWB 10 side and the end portion 23a of the ground layer (first conductor layer) 23 or the end portions 24a of the signal lines (second conductor layer) 24 on the double-sided FPC 20 side to one another.

Here, the term "distance" between conductors means the sum of the spatial distance and the creeping distance. The term "spatial distance" means a slant distance when no board exists between the conductors. The term "creeping distance" means, when there is a board or boards between the conductors, the distance along the surface or the surfaces of the board or the boards. Referring to FIG. 2A, in the case of the end portion 23b of the ground layer 23 of the double-sided FPC 20 and the end portion 24a of a corresponding one of the signal lines 24 of the double-sided FPC 20, the distance between the conductors is the sum of a distance $L_1$ between an end surface of the end portion 23b and the end surface 20a of the double-sided FPC 20, a thickness $L_2$ of the end surface 20a of the double-sided FPC 20, and the distance between the end portion 24a of the signal line 24 and the end surface 20a of the double-sided FPC 20 (zero in the case of FIG. 2A). Also in FIG. 2A, in the case of the end portion 24a of the signal line 24 of the double-sided FPC 20 and the pad 13a of a corresponding one of the wiring traces 12 of the PWB 10, the distance between the conductors is a gap between the end portion 24a of the signal line 24 and the pad 13a.

A Method of Mounting the Double-Sided FPC 20 on the PWB 10

Figure 5:
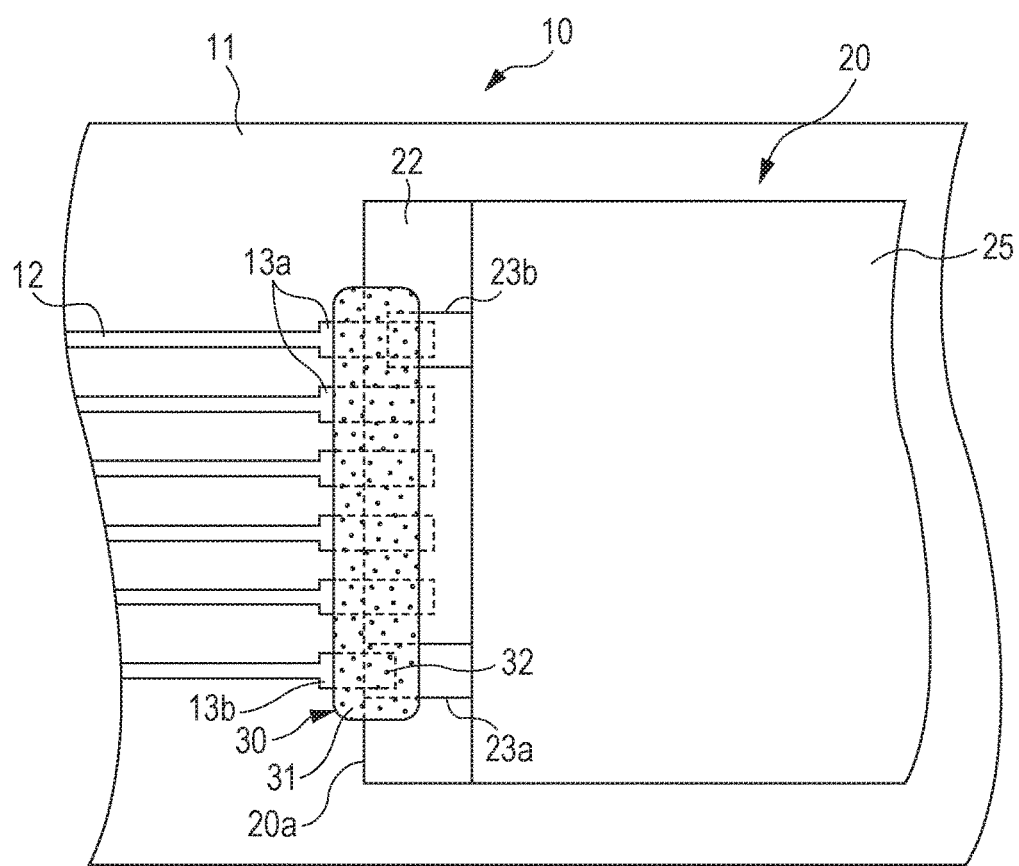
FIG. 5 is a plan view of part of the conductor connecting structure before anisotropic conductive paste is heated.

Next, an example of a method of mounting the double-sided FPC 20 on the PWB 10 is described with reference to FIGS. 1 to 5. FIG. 5 is a plan view of part of the conductor connecting structure before the anisotropic conductive paste 30 is heated.

Before Heating

The double-sided FPC 20 is disposed at an intended position on the PWB 10, and, as illustrated in FIG. 5, the anisotropic conductive paste 30 is applied to a required position. Before the anisotropic conductive paste 30 is heated, in a portion along the II-II section of FIG. 1, since the solder particles 32 are dispersed as illustrated in FIG. 2B, the pad 13a of one of the wiring traces 12 and the end portion 24a of a corresponding one of the signal lines 24 are not solder connected to each other. In a portion along the III-III section of FIG. 1, since the solder particles 32 are dispersed as illustrated in FIG. 3B, the pad 13b of the wiring trace 12 and the end portion 23a of the ground layer 23 are not solder connected to each other.

After Heating

When the anisotropic conductive paste 30 has been heated, in the portion along the II-II section of FIG. 1, since the distance between the pad 13a of the wiring trace 12 and the end portion 24a of the signal line 24 is the first value or less, the solder particles 32 grow, and accordingly, a corresponding one of the solder growth portions 33 is formed as illustrated in FIG. 2A. Thus, the pad 13a and the end portion 24a of the signal line 24 are solder connected to each other. In the portion along the III-III section of FIG. 1, since the distance between the pad 13b of the wiring trace 12 and the end portion 23a of the ground layer 23 is the first value or less, the solder particles 32 grow, and accordingly, a corresponding one of the solder growth portions 33 is formed as illustrated in FIG. 3A. Thus, the pad 13b and the end portion 23a are solder connected to each other.

In contrast, since the distance between the pad 13a of the wiring trace 12 and the end portion 23b of the ground layer 23 is the second value or more, as illustrated in FIG. 2A, the solder particles 32 do not grow. Thus, the pads 13a and the end portion 23b are not solder connected to each other. Furthermore, since the distance between the pad 13b of the wiring trace 12 and the end portion 24b of the signal line 24 is the second value or more, as illustrated in FIG. 3A, the solder particles 32 do not grow. Thus, the pads 13b and the end portion 24b of the signal line 24 are not solder connected to each other.

First Example

Although the present invention will be specifically described below with an example, the present invention is not limited to the example.

A plated silicon nano hybrid board (made by Arakawa Chemical Industries, Ltd.) is used as the double-sided FPC 20 of the example of the present invention. This double-sided FPC 20 includes the base material 21 formed of Pomiran (polyimide film) having a thickness of 25 μm. The base material 21 has the surfaces 21a and 21b on which 5 μm thick copper foils are formed. The copper foils are subjected to processing such as etching so as to form circuitry including the signal lines 24 and the ground layer 23. Next, 25 μm thick protective layers 25 formed of polyimide films are formed on the copper foils with 25 μm thick adhesive tape (T4103, made by Dexerials Corporation) interposed therebetween. The thickness of the base material 21 is 35 μm, and the total thickness of the double-sided FPC 20 is 135 μm. By setting the line width of the signal lines 24 to 55 μm in the circuit in which the differential impedance is controlled to 100Ω in the design, an FPC is formed which may have well satisfying high-speed transmission properties and the flexibility.

Next, the anisotropic conductive paste 30 made by Sekisui Chemical CO., LTD. is applied to portions of the PWB 10 and the double-sided FPC 20 intended to be connected. At this time, the anisotropic conductive paste 30 is applied not only to a region where the signal lines 24 are formed but on both sides of the double-sided FPC 20. After that, the anisotropic conductive paste 30 is heated for 60 seconds at 150° C. so as to establish solder connection. Regarding the distance between the pads 13a and 13b of the PWB 10 and the end portions 23a and 23b of the ground layer 23 or the end portions 24a and 24b of the signal lines 24 of the double-sided FPC 20, when the distance is 80 μm or less, the solder particles 32 are able to grow, and accordingly, solder connection is established, and when the distance is 100 μm or more, the solder particles 32 are unable to grow, and accordingly, insulation is formed. Thus, it is found that both the sides of the double-sided FPC 20 are able to be solder connected to the PWB 10 without a through hole in the double-sided FPC 20.

The exemplary embodiment of the present invention is not limited to the above-described exemplary embodiment and may be varied and carried out in a variety of manners as long as the gist of the present invention is not changed. The double-sided FPC may have a through hole.

Some of the elements of the above-described exemplary embodiment may be omitted as long as the gist of the present invention is not changed. Steps may be, for example, added to, deleted from, changed in, or interchanged in the processing according to the above-described exemplary embodiment.

The foregoing description of the exemplary embodiment of the present invention has been provided for the purposes of illustration and description. It is not intended to be exhaustive or to limit the invention to the precise forms disclosed. Obviously, many modifications and variations will be apparent to practitioners skilled in the art. The embodiment was chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A conductor connecting structure comprising:
    a mounting board that includes:
        a base material formed of an insulating material, the base material including:
            a first surface,
            a second surface, and
            an end surface,
        a first conductor layer that is formed on the first surface and that has an end portion, and
        a second conductor layer that is formed on the second surface and that has an end portion;
    a target board that includes
        a mounting surface on which the mounting board is mounted, and
        a third conductor layer formed on the mounting surface; and
    an anisotropic conductive material that includes
        a polymeric material, and
        electrically conductive particles that are dispersed in the polymeric material and that, when the electrically conductive particles are heated, aggregate so as to connect the end portion of the first conductor layer or the end portion of the second conductor layer and the third conductor layer to each other, wherein, in the mounting board, one end portion not subjected to connection established with the anisotropic conductive material out of the end portion of the first conductor layer and the end portion of the second conductor layer is separated further from the end surface of the base material than another end portion connected to the third conductor layer out of the end portion of the first conductor layer and the end portion of the second conductor layer, and wherein one of the first conductor layer and the second conductor layer is a ground layer, and wherein the mounting board is a double-sided flexible printed circuit a thickness of the base material of which is 50 μm or less.

2. The conductor connecting structure according to claim 1,
wherein a distance between the third conductor layer and the other end portion of the mounting board connected to the third conductor layer is 80 μm or less, and a distance between the third conductor layer and the one end portion of the mounting board not connected to the third conductor layer is 100 μm or more.

3. The conductor connecting structure according to claim 1,
wherein, when the mounting board is mounted on the target board with the second surface facing the target board, the first conductor layer is the ground layer and the second conductor layer includes a plurality of wires.

4. The conductor connecting structure according to claim 1,
wherein, in the mounting board, the first conductor layer and the second conductor layer are not connected to each other through a through hole.

5. A mounting board to be mounted on a target board that includes a mounting surface on which the mounting board is to be mounted and that includes a third conductor layer formed on the mounting surface, the mounting board comprising:
a base material that is formed of an insulating material, the base material including:
a first surface,
a second surface, and
an end surface;
a first conductor layer that is formed on the first surface and that has an end portion; and
a second conductor layer that is formed on the second surface and that has an end portion,
wherein one end portion not to be connected to the third conductor layer out of the end portion of the first conductor layer and the end portion of the second conductor layer is separated further from the end surface of the base material than another end portion to be connected to the third conductor layer out of the end portion of the first conductor layer and the end portion of the second conductor layer,
wherein one of the first conductor layer and the second conductor layer is a ground layer and another of the first conductor layer and the second conductor layer includes a plurality of wires, and
wherein a first wire end portion of a first wire from among the plurality of wires is separated further from the end surface of the base material than a second wire end portion of a second wire from among the plurality of wires.

6. The mounting board according to claim 5,
wherein, when the mounting board is mounted on the target board, a distance between the third conductor layer and the other end portion connected to the third conductor layer is 80 μm or less, and a distance between the third conductor layer and the one end portion not connected to the third conductor layer is 100 μm or more.

7. The mounting board according to claim 5,
wherein the first conductor layer and the second conductor layer are not connected to each other through a through hole.

8. A conductor connecting structure comprising:
a mounting board that includes
a base material that is formed of an insulating material and that includes
a first surface,
a second surface, and
an end surface,
a first conductor layer that is formed on the first surface and that has an end portion, and
a second conductor layer that is formed on the second surface and that has an end portion; and
a target board that includes
a mounting surface on which the mounting board is mounted, and
a third conductor layer formed on the mounting surface; and
an anisotropic conductive material that includes
a polymeric material, and
electrically conductive particles that are dispersed in the polymeric material and that, when the electrically conductive particles are heated, aggregate so as to connect the end portion of the first conductor layer or the end portion of the second conductor layer and the third conductor layer to each other,
wherein, in the mounting board, one end portion not subjected to connection established with the anisotropic conductive material out of the end portion of the first conductor layer and the end portion of the second conductor layer is separated further from the end surface of the base material than another end portion connected to the third conductor layer out of the end portion of the first conductor layer and the end portion of the second conductor layer, and
wherein a distance between the third conductor layer and the other end portion of the mounting board connected to the third conductor layer is 80 μm or less, and a distance between the third conductor layer and the one end portion of the mounting board not connected to the third conductor layer is 100 μm or more.

9. A conductor connecting structure comprising:
a mounting board that includes
a base material that is formed of an insulating material and that includes
a first surface,
a second surface, and
an end surface,
a first conductor layer that is formed on the first surface and that has an end portion, and
a second conductor layer that is formed on the second surface and that has an end portion; and
a target board that includes a mounting surface on which the mounting board is mounted, and
a third conductor layer formed on the mounting surface; and
an anisotropic conductive material that includes
a polymeric material, and
electrically conductive particles that are dispersed in the polymeric material and that, when the electrically conductive particles are heated, aggregate so as to connect the end portion of the first conductor layer or the end portion of the second conductor layer and the third conductor layer to each other,
wherein, in the mounting board, one end portion not subjected to connection established with the anisotropic conductive material out of the end portion of the first conductor layer and the end portion of the second conductor layer is separated further from the end surface of the base material than another end portion connected to the third conductor layer out of the end portion of the first conductor layer and the end portion of the second conductor layer,
wherein, when the mounting board is mounted on the target board with the second surface facing the target board, the first conductor layer is a ground layer and the second conductor layer includes a plurality of wires, and
wherein the mounting board is a double-sided flexible printed circuit a thickness of the base material of which is 50 μm or less.

10. A conductor connecting structure comprising:
a mounting board that includes
a base material that is formed of an insulating material and that includes
a first surface,
a second surface, and
an end surface,
a first conductor layer that is formed on the first surface and that has an end portion, and
a second conductor layer that is formed on the second surface and that has an end portion; and
a target board that includes
a mounting surface on which the mounting board is mounted, and
a third conductor layer formed on the mounting surface; and
an anisotropic conductive material that includes
a polymeric material, and
electrically conductive particles that are dispersed in the polymeric material and that, when the electrically conductive particles are heated, aggregate so as to connect the end portion of the first conductor layer or the end portion of the second conductor layer and the third conductor layer to each other, wherein, in the mounting board, one end portion not subjected to connection established with the anisotropic conductive material out of the end portion of the first conductor layer and the end portion of the second conductor layer is separated further from the end surface of the base material than another end portion connected to the third conductor layer out of the end portion of the first conductor layer and the end portion of the second conductor layer, and
wherein, in the mounting board, the first conductor layer and the second conductor layer are not connected to each other through a through hole.

11. A mounting board to be mounted on a target board that includes a mounting surface on which the mounting board is to be mounted and that includes a third conductor layer formed on the mounting surface, the mounting board comprising:
a base material that is formed of an insulating material, the base material including:
a first surface,
a second surface, and
an end surface;
a first conductor layer that is formed on the first surface and that has an end portion; and
a second conductor layer that is formed on the second surface and that has an end portion,
wherein one end portion not to be connected to the third conductor layer out of the end portion of the first conductor layer and the end portion of the second conductor layer is separated further from the end surface of the base material than another end portion to be connected to the third conductor layer out of the end portion of the first conductor layer and the end portion of the second conductor layer,
wherein one of the first conductor layer and the second conductor layer is a ground layer and another of the first conductor layer and the second conductor layer includes a plurality of wires,
wherein a first wire end portion of a first wire from among the plurality of wires is separated further from the end surface of the base material than a second wire end portion of a second wire from among the plurality of wires, and
wherein, when the mounting board is mounted on the target board, a distance between the third conductor layer and the other end portion connected to the third conductor layer is 80 μm or less, and a distance between the third conductor layer and the one end portion not connected to the third conductor layer is 100 μm or more.

* * * * *